(12) United States Patent
Sato et al.

(10) Patent No.: US 8,633,114 B2
(45) Date of Patent: Jan. 21, 2014

(54) METHODS FOR MANUFACTURING HIGH DIELECTRIC CONSTANT FILMS

(75) Inventors: Tatsuya E. Sato, San Jose, CA (US); Maitreyee Mahajani, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 220 days.

(21) Appl. No.: 13/104,521

(22) Filed: May 10, 2011

(65) Prior Publication Data

US 2012/0289052 A1 Nov. 15, 2012

(51) Int. Cl.
*H01L 21/302* (2006.01)

(52) U.S. Cl.
USPC ............ 438/704; 257/E21.214; 438/778; 427/255.19

(58) Field of Classification Search
None
See application file for complete search history.

(56) References Cited

U.S. PATENT DOCUMENTS

| | | | |
|---|---|---|---|
| 6,645,882 B1 | 11/2003 | Halliyal et al. | |
| 6,740,605 B1 * | 5/2004 | Shiraiwa et al. | 438/795 |
| 6,849,925 B1 | 2/2005 | Halliyal et al. | |
| 6,949,433 B1 * | 9/2005 | Hidehiko et al. | 438/261 |
| 7,101,812 B2 | 9/2006 | Eisele et al. | |
| 7,122,415 B2 | 10/2006 | Jang et al. | |
| 7,135,361 B2 | 11/2006 | Visokay et al. | |
| 7,553,772 B1 * | 6/2009 | Gu et al. | 438/709 |
| 2002/0098627 A1 | 7/2002 | Pomarede et al. | |
| 2002/0142624 A1 | 10/2002 | Levy et al. | |
| 2003/0101938 A1 | 6/2003 | Ronsse et al. | |
| 2003/0232501 A1 | 12/2003 | Kher et al. | |
| 2004/0092073 A1 * | 5/2004 | Cabral et al. | 438/287 |
| 2004/0112964 A1 * | 6/2004 | Empedocles et al. | 235/491 |
| 2004/0266141 A1 | 12/2004 | Tao et al. | |
| 2005/0170667 A1 | 8/2005 | Conley et al. | |
| 2005/0199731 A9 * | 9/2005 | Empedocles et al. | 235/491 |
| 2005/0282400 A1 | 12/2005 | Xiao et al. | |
| 2006/0008997 A1 | 1/2006 | Jang et al. | |
| 2006/0138603 A1 * | 6/2006 | Cabral et al. | 257/635 |
| 2006/0169788 A1 * | 8/2006 | Empedocles et al. | 235/492 |
| 2006/0237537 A1 * | 10/2006 | Empedocles et al. | 235/439 |
| 2007/0176824 A1 * | 8/2007 | Stumbo et al. | 342/372 |
| 2008/0132084 A1 | 6/2008 | Miya et al. | |
| 2009/0053906 A1 | 2/2009 | Miya et al. | |
| 2010/0087052 A1 | 4/2010 | Xu | |
| 2010/0184281 A1 * | 7/2010 | Hsu et al. | 438/591 |
| 2012/0289052 A1 * | 11/2012 | Sato et al. | 438/704 |
| 2012/0289063 A1 * | 11/2012 | Sato et al. | 438/785 |

OTHER PUBLICATIONS

PCT International Search Report & Written Opinion in PCT/US2012/037030, mailed Nov. 16, 2012, 9 pgs.
Non-Final Office Action in U.S. Appl. No. 13/189,982, dated Feb. 25, 2013, 15 pgs.

* cited by examiner

*Primary Examiner* — Allan Olsen
(74) *Attorney, Agent, or Firm* — Servilla Whitney LLC

(57) ABSTRACT

Provided are methods for depositing a high-k dielectric film on a substrate. The methods comprise annealing a substrate after cleaning the surface to create dangling bonds and depositing the high-k dielectric film on the annealed surface.

20 Claims, 3 Drawing Sheets

METHODS FOR MANUFACTURING HIGH DIELECTRIC CONSTANT FILMS

BACKGROUND

Embodiments of the invention generally relate to methods for depositing materials. More specifically, embodiments of the invention are directed to methods of depositing high-k dielectric films.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

Over the past decades, the MOSFET has continually been scaled down in size and modern integrated circuits are incorporating MOSFETs with channel lengths of less than 0.1 micron. Devices with a 65 nm feature size (with the channel being even shorter) are currently in production. The decrease in feature size has resulted in certain challenges because small MOSFETs exhibit higher leakage currents, and lower output resistance than larger devices. Still, smaller MOSFETs are desirable for several reasons. The main reason to make transistors smaller is to pack more and more devices in a given chip area, reducing the price per chip. Additionally, the reduction in transistor dimension can help increase the speed.

Because of small MOSFET geometries, the voltage that can be applied to the gate must be reduced to maintain reliability. To maintain performance, the threshold voltage of the MOSFET has to be reduced as well. As threshold voltage is reduced, the transistor cannot be switched from complete turn-off to complete turn-on with the limited voltage swing available. Subthreshold leakage, which was ignored in the past, now can have a significant impact on device performance.

A gate electrode is part of an integrated circuit. For example, a CMOS transistor comprises a gate structure disposed between source and drain regions that are formed in the semiconductor substrate. The gate structure generally comprises a gate electrode and a gate dielectric. The gate electrode is disposed over the gate dielectric to control a flow of charge carriers in a channel region that is formed between drain and source regions beneath the gate dielectric. The gate dielectric typically comprises a thin material layer having a dielectric constant of about 4.0 or greater (for example, gate oxides such as silicon dioxide (SiO2), silicon oxynitride (SiON), and the like). As the gate length of silicon CMOS devices is scaled to less than 100 nm, new high dielectric constant (K) materials will likely replace silicon oxide. In addition, metal gates will likely replace polycrystalline silicon (polysilicon) gates. For example, in some CMOS transistors, the gate electrode may be formed from at least one of a metal (e.g., titanium (Ti), tantalum (Ta), tungsten (W), and the like) and metal-containing conductive compound (e.g., titanium nitride (TiN), tantalum nitride (TaN), tungsten nitride (WN), and the like). Replacement of polysilicon as a traditional material of the gate electrode with metals and metal-containing compounds reduces undesired voltage drops associated with the polysilicon depletion effect, as well as increases drive current performance and the operational speed of the CMOS transistor.

The gate oxide, which serves as insulator between the gate and channel, should be made as thin as possible to increase the channel conductivity and performance when the transistor is on and to reduce subthreshold leakage when the transistor is off. However, with current gate oxides with a thickness of around 1.2 nm (which in silicon is ~5 atoms thick) the quantum mechanical phenomenon of electron tunneling occurs between the gate and channel, leading to increased power consumption.

Insulators (referred to as high-k dielectrics) that have a larger dielectric constant than silicon dioxide, such as group IVb metal silicates, for example, hafnium and zirconium silicates and oxides are being used to reduce the gate leakage. Increasing the dielectric constant of the gate dielectric allows a thicker layer while maintaining a high capacitance. (Capacitance is proportional to dielectric constant and inversely proportional to dielectric thickness.) Generally, a higher dielectric thickness reduces the quantum tunneling current through the dielectric between the gate and the channel. However, the difference in conduction band energy between the semiconductor and the dielectric (and the corresponding difference in valence band energy) impacts leakage current level. For the traditional gate oxide, silicon dioxide, the former barrier is approximately 8 eV. For many alternative dielectrics, the value is significantly lower, tending to increase the tunneling current, somewhat negating the advantage of higher dielectric constant.

As mentioned above, alternative materials have been proposed for use as gate dielectric materials, in particular hafnium-containing materials such as hafnium dioxide ($HfO_2$), and hafnium-containing silicate ($Hf_xSi_yO$). Although improvements to semiconductor gate electrodes have been made through the use of alternative gate metals and gate dielectric materials, further improvements are desired to improve the performance of integrated circuit devices, for example, to reduce leakage current density.

There is an ongoing need in the art for methods of rapidly and efficiently depositing high-k films.

SUMMARY

Embodiments of the invention are directed to methods of processing a substrate. The surface of the substrate is cleaned to produce a native substrate surface. The native substrate surface is annealed to create a substrate surface with dangling bonds. A high-k dielectric film is deposited on the substrate surface with dangling bonds.

In detailed embodiments, cleaning the substrate surface comprises one or more of a hydrofluoric acid wet etch and an ammonia and nitrogen trifluoride plasma dry etch procedure.

In some embodiments, annealing the native substrate surface comprises exposing the native substrate surface to a temperature in the range of about 600° C. to about 110° C. In detailed embodiments, the native substrate surface is annealed in an inert environment. In specific embodiments, the native substrate surface is annealed for a time in the range of about 1 seconds to about 300 seconds. In one or more embodiments, the native substrate surface is annealed for less than 1 seconds by laser annealing.

In some embodiments, the high-k dielectric film comprises one or more of a metal oxide and metal silicate including an element selected from the group consisting of Hf, Zr, Ta, La, Gd, Y, Al, Pr, Sc, Ti, In, Lu, rare-earth metal and combinations thereof. In detailed embodiments, the high-k dielectric film comprises hafnium oxide. In specific embodiments, depositing the hafnium oxide film comprises sequentially exposing the substrate surface with dangling bonds to a hafnium-containing precursor comprising hafnium tetrachloride and an oxidant comprising water.

According to one or more embodiments, the substrate is one or more of silicon, gallium, indium, aluminum, titanium, germanium and tin. In detailed embodiments, the native substrate surface is the substrate surface comprising functional groups consisting of one or more of hydride, nitride, fluoride, chloride, bromide and iodide.

In some embodiments, the substrate is cleaned, annealed and a film is deposited without being exposing the substrate to ambient conditions.

In specific embodiments, the high-k dielectric film is deposited by atomic layer deposition.

Additional embodiments of the invention are directed to methods of processing a substrate. A substrate having a surface is disposed in a first processing chamber. The surface of the substrate is cleaned to produce a native substrate surface. The substrate being cleaned by one or more of a hydrofluoric acid wet etch and an ammonia and nitrogen trifluoride dry etch. The native substrate surface is annealed by exposing the native substrate surface to a temperature in the range of about 600° C. to about 1100° C. to create a substrate surface with dangling bonds. A high-k dielectric film is deposited on the substrate surface with dangling bonds by atomic layer deposition.

Some embodiments further comprise moving the substrate between the first processing chamber and at least one second processing chamber before one of the annealing or deposition. In specific embodiments, the substrate is moved from the first processing chamber to that at least one second processing chamber without being exposed to ambient conditions.

Further embodiments of the invention are directed to methods of processing a substrate. A silicon substrate having a surface is disposed in a first processing chamber. The surface of the silicon substrate is cleaned in the first processing chamber to produce a native substrate surface comprising silicon hydride. The silicon substrate surface is cleaned by one or more of a hydrofluoric acid wet etch and an ammonia and nitrogen trifluoride dry etch. The native substrate surface is annealed by exposing the native substrate surface to a temperature in the range of about 700° C. to about 1100° C. to create silicon dangling bonds on the surface of the substrate. A high-k dielectric film is deposited on the substrate surface with dangling silicon bonds by atomic layer deposition.

In some embodiments, depositing the high-k dielectric film comprises sequentially exposing the substrate surface having silicon dangling bonds to a hafnium containing precursor and water or ozone to form a hafnium oxide film. In specific embodiments, the hafnium oxide film has a thickness of at least twice that of a similarly prepared hafnium oxide film processed without annealing the native substrate surface comprising silicon hydride to create silicon dangling bonds.

Detailed embodiments further comprise moving the substrate from the first processing chamber to a second processing chamber before annealing the substrate or before depositing the high-k dielectric film.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

One aspect of the present invention relates to methods for manufacturing high K dielectric films, which may be utilized in the manufacture of MOSFETS and other devices incorporating high K dielectric films. Another aspect of the invention relates to articles of manufacture including, but not limited to, high K dielectric films and devices that include high K dielectric films.

Embodiments of the invention are useful in the manufacture of semiconductor devices, including but not limited to semiconductor devices that require a capacitive element. Examples of such devices include metal oxide semiconductor field effect transistors (MOSFET), metal oxide semiconductor capacitor (MOSCAP), metal-insulator-metal capacitors (MIMCAP), and metal-insulator-semiconductor capacitor (MISCAP). With scaling semiconductor devices that require capacitive elements, the equivalent oxide thickness (EOT) is reduced to improve the device performance at each node. The reduction in EOT comes with an unwanted increase in leakage current. At a specified EOT value, a higher-k material will allow a physically thicker film, and thus provide lower leakage current.

Embodiments of the invention are directed to methods of fabricating low EOT high-k gate stacks for semiconductor devices by eliminating the bottom interface layer between the substrate and the dielectric layer. For example, a silicon substrate may commonly have a thin silicon oxide interface layer, over which the dielectric material is deposited. Embodiments of the invention enables atomic layer deposition (ALD) film growth directly on the substrate after surface modification and are capable of fabricating transistor gate stacks without thin interface layers. Without surface modification, the dielectric film does not grow immediately and will often group with poor film properties.

Figure 1:
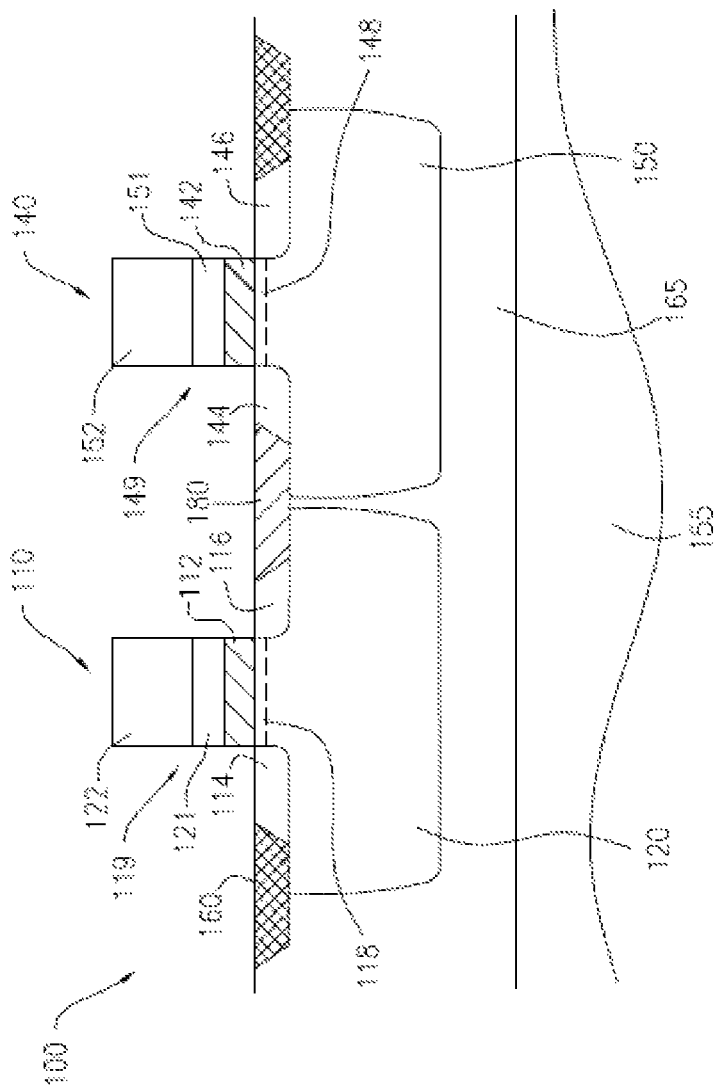
FIG. 1 is a cross-sectional view of a field effect transistor pair.

One or more embodiments of the present invention provide methods that are particularly useful in forming complementary metal oxide semiconductor (CMOS) integrated-circuit devices and will be described in that context. Other devices and applications are also within the scope of the invention. FIG. 1 illustrates portions of a cross sectional view of a FET pair in a typical CMOS device. The FET pair shown comprises an NMOS FET and a PMOS FET, but it will be understood that the CMOS device can comprise additional FETs, and include FETs having the same conductivity type. Device 100 comprises a silicon substrate 155 doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. Region 180 electrically isolates NMOS 110 and PMOS 140 transistors and region 160 electrically isolates the pair of transistors 110 and 140 from other semiconductor devices on substrate 155.

According to one or more embodiments of the invention, NMOS transistor 110 comprises a gate region 119, source region 114 and a drain region 116. The gate region 119 includes a first metal region 121 and a second metal region 122. The source and drain regions are n-type regions on opposite sides of the gate region 119. Channel region 118 is interposed between source region 114 and drain region 116. A gate dielectric layer 112 separates channel region 118 and first metal region 121. Gate dielectric layer 112 electrically insulates first metal region 121 from channel region 118. The gate dielectric layer 112, the first metal region 121 and second metal region 122 together may be referred to herein as a gate stack. The gate dielectric region 112 according to one or more embodiments is a high-k dielectric material such as $HfO_2$. The first metal region 121 comprises a conductor material, typically a metal such as tantalum nitride (TaN), which may be formed by atomic layer deposition (ALD). The second metal region 122 comprises a metal, for example, tantalum, which may be formed by any suitable process such as PVD. When an appropriate voltage is applied between p-type silicon substrate 155 and gate region 122, electrons from p-well 120 move into region 118 directly below dielectric layer 112 thereby creating an n-type channel 118. A voltage applied between source 114 and drain 116 causes current to flow between source 114 and drain 116.

According to one or more embodiments, PMOS transistor 140 comprises a gate region 149, a source region 144 and a drain region 146. The gate region 149 includes a first metal region 151 and a second metal region 152. The source and drain regions are p-type regions on opposite sides of gate region 149. Channel region 148 is interposed between source region 144 and drain region 146. A gate dielectric 142 separates channel region 148 and first metal region 151. Dielectric 142 electrically insulates first metal region 151 from channel region 148. The gate dielectric layer 142, the first metal region 151 and second metal region 152 together may be referred to herein as a gate stack. Suitable gate materials include nitride materials such as, but not limited to, TiN and TaN. In one or more embodiments, the first metal region 151 comprises a metal, typically TaN. The second metal region 152 comprises a metal, for example, tantalum. When an appropriate voltage is applied between p-type silicon substrate 155 and gate region 149, holes from n-well 150 move into region 148 directly below dielectric layer 142 thereby creating a p-type channel 148. A voltage applied between source 144 and drain 146 causes current to flow between source 144 and drain 146.

MOS device design is a complicated process. For example, in the design of MOSFETs, improvements made by maximizing drive current result in increased leakage current. Conversely, an improvement such as decreased leakage current negatively impacts the drive current.

Embodiments of the invention described herein involve the formation of high-k films on substrates. Examples of substrates include, but are not limited to, semiconductor wafers, such as crystalline silicon (e.g., Si<100> or Si<111>), silicon oxide, silicon germanium, doped or undoped polysilicon, doped or undoped silicon wafers, silicon nitride, gallium wafers, indium wafers, aluminum wafers, tin wafers and patterned or non-patterned wafers. The terms "wafer" and "substrate" are used interchangeably.

Accordingly, one or more embodiments of the invention are directed to methods for forming a high-k dielectric film. As used in this specification and the appended claims, the term "substrate surface" refers to either a bare substrate surface or a substrate surface having a layer thereon. For example, if a first processing step deposits a layer A and precursor B is said to react with the substrate surface, then the substrate surface that precursor B reacts with is either the bare substrate or the layer A.

Accordingly, one or more embodiments of the invention are directed to methods of processing a substrate. A surface of the substrate is cleaned to produce a native substrate surface. As used in this specification and the appended claims, the term "native substrate surface" means the substrate surface comprising a low free energy surface termination bonds to specific elements. For example, the low free energy surface chemistry can be, for example, a hydride, oxide, nitride or halide functional groups on the bulk substrate material. Examples of native substrate surfaces include, but are not limited to, silicon hydride, gallium nitride, indium oxide, aluminum fluoride and tin chloride. The low free energy surface chemistry for silicon may be, for example, silicon hydride, silicon oxide, silicon nitride, silicon fluoride and silicon chloride.

Any suitable cleaning method producing a native substrate surface can be employed. The cleaning method can be either a wet clean or a dry clean (e.g., wet etch or dry etch) procedure. In detailed embodiments, the substrate surface is cleaned with a hydrofluoric acid wet etch known to those skilled in the art.

An exemplary dry etch process for use with one or more embodiments of the invention involved using an ammonia and nitrogen trifluoride gas mixture. Ammonia and nitrogen trifluoride are combined to form a cleaning mixture. The amount of each gas can be adjusted to accommodate, for example, the thickness of the oxide layer to be removed, the geometry of the substrate being cleaned, the volume capacity of the chamber where a plasma is formed and the volume capacity of the processing chamber. For example, the ammonia and nitrogen trifluoride are present in a molar ratio in the range of about 1:1 to about 30:1. In various embodiments, the molar ratio of the ammonia to nitrogen trifluoride is in the range of about 2:1 to about 20:1, or in the range of about 3:1 to about 15:1, or in the range of about 5:1 to about 10:1, or in the range of about 10:1 to about 20:1.

A purge gas (also referred to as a carrier gas or diluent gas) may be added to the gas mixture. Any suitable purge gas may be used, such as, but not limited to, argon, helium, hydrogen, nitrogen and mixtures thereof. Typically, the overall gas mixture is in the range of about 0.05% to about 20% by volume of ammonia and nitrogen trifluoride. The remainder being the purge gas.

The gas mixture (ammonia, nitrogen trifluoride and purge gas) are maintained at a suitable operating pressure. Typically, the pressure is maintained in a range of about 500 mTorr and 30 Torr. In various embodiments, the pressure is maintained in a range of about 1 Torr to about 10 Torr, or in the range of about 2 Torr and about 8 Torr, or in the range of about 3 Torr to about 6 Torr.

A plasma of the gas mixture is formed. The plasma is either formed within the chamber supporting the substrate to be cleaned, or is formed remotely and introduced to the chamber supporting the substrate. Without being bound by any particular theory of operation, it is believed that the plasma energy dissociates the ammonia and nitrogen trifluoride gases into reactive species that combine to form a highly reactive ammonium fluoride ($NH_4F$) and/or ammonium hydrogen fluoride ($NH_4F$—HF) in the gas phase. These molecules then react with the substrate surface to be cleaned. Again, without being bound by any particular theory of operation, it is believed that the etchant gas forms a volatile film on the substrate surface. The volatile film can be removed by heating the substrate, typically, to a temperature in the range of about 75° C. to about 200° C.

After the substrate has been cleaned to leave a native substrate surface, the substrate surface is annealed. Without being bound by any particular theory of operation, it is believed that annealing breaks the surface chemistry of the native substrate surface. Annealing the substrate native substrate surface results in a substrate surface with dangling bonds (i.e., surface radicals). Accordingly, suitable low free energy surface chemistries are those which will be affected by high temperature annealing, leaving a surface with dangling bonds.

Annealing the substrate involves heating the substrate to a temperature sufficient to decompose the surface chemistry of the substrate to form dangling bonds. The temperature required for each substrate material will depend on the properties of that particular substrate. For example, a silicon substrate may require a different temperature to produce silicon dangling bonds than a germanium substrate requires to produce germanium dangling bonds. In various embodiments, annealing the native substrate surface comprises exposing the native substrate surface to a temperature in the range of about 500° C. to about 1400° C., or in the range of about 600° C. to about 1300° C., or in the range of about 600° C. to about 1200° C., or in the range of about 600° C. to about 1100° C., or in the range of about 700° C. to about 100° C.

Annealing the substrate can be performed in a variety of environments. In detailed embodiments, the native substrate surface is annealed in an inert environment. Suitable inert environments include, but are not limited to, nitrogen, argon, helium, neon and combinations thereof.

The length of time that the native substrate surface is annealed for depends on, for example, the annealing temperature and the annealing technique. Suitable annealing techniques include, but are not limited to, rapid thermal annealing and laser annealing. In detailed embodiments, the native substrate surface is annealed for a time in the range of about 0.5 seconds to about 500 seconds. In various embodiments, the native substrate surface is annealed for a time in the range of about 1 seconds to about 300 seconds, or in the range of about 2 seconds to about 200 seconds, or in the range of about 3 seconds to about 100 seconds. In specific embodiments, the native substrate surface is annealed for less than 1 second by laser annealing.

After cleaning and annealing the substrate, a high-k dielectric film is deposited onto the substrate surface. Without being bound by any particular theory of operation, it is believed that the high-k film growth rate is enhanced at least in part due to the presence of dangling bonds on the substrate surface.

The high-k dielectric film can be any suitable film. In detailed embodiments, the high-k dielectric film comprises an element selected from the group consisting of Hf, Zr, Ta, La, Gd, Y, Al, Pr, Sc, Ti, In, Lu, rare-earth metals and combinations thereof. In specific embodiments, the high-k film metal oxides and/or metal silicates of one or more of Hf, Zr, Ta, La, Gd, Y, Al, Pr, Sc, Ti, In, Lu, rare-earth metals and combinations thereof. In detailed embodiments, the high-k dielectric film comprises hafnium oxide.

The high-k dielectric film can be deposited by any suitable technique, including, but not limited to, chemical vapor deposition (CVD) and atomic layer deposition (ALD). In detailed embodiments, the high-k film is deposited by atomic layer deposition. In a specific embodiment, the substrate surface with dangling bonds is sequentially exposed to a precursor gas comprising one or more of the materials listed above followed by exposure to a precursor gas comprising an oxidant.

Many precursors are within the scope of the invention. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos and anilides. Precursors can be comprised of organometallic and Inorganic/halide compounds Exemplary hafnium precursors include hafnium compounds containing ligands such as alkylamidos, cyclopentadienyls, halides, alkyls, alkoxides and combinations thereof. Alkylamido hafnium compounds used as hafnium precursors include $(RR'N)_4Hf$, where R and R' are independently hydrogen, methyl, ethyl, propyl or butyl. Some specific hafnium precursors include $(Et_2N)_4Hf$, $(Me_2N)_4Hf$, $(EtMeN)_4Hf$, $(t-BuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(i-PrC_5H_4)_2HfCl_2$, $(i-PrC_5H_4)HfCl_3$, $(t-BuC_5H_4)_2HfMe_2$, $(acac)_4Hf$, $(hfac)_4Hf$, $(tfac)_4Hf$, $(thd)_4Hf$, $Br_4Hf$, $Cl_4Hf$, $I_4Hf$, $(NO_3)_4Hf$, $(t-BuO)_4Hf$, $(i-PrO)_4Hf$, $(EtO)_4Hf$ and $(MeO)_4Hf$. In detailed embodiments, the hafnium containing precursor is hafnium tetrachloride.

Exemplary oxidants include, but are not limited to, $H_2O$, $H_2O_2$, $O_3$, $O_2$, $NO$, $N_2O$, $NO_2$, $N_2O_5$, alcohols (e.g., ROH, where R=Me, Et, Pr and Bu), peroxides (organic and inorganic) carboxylic acids and radical oxygen compounds (e.g., O, $O_2$, $O_3$ and OH radicals). Radical oxygen compounds can be produced by heat, hot-wires and/or plasma. In specific embodiments, the oxidant is water.

The processes of the invention can be carried out in equipment known in the art of ALD, CVD, etc. The apparatus brings the sources into contact with a substrate on which the films are grown. Hardware that can be used to deposit films include ALD apparatus as disclosed in U.S. patent application Ser. No. 10/251,715, filed Sep. 20, 2002, assigned to Applied Material, Inc., Santa Clara, Calif. and entitled "An Apparatus for the Deposition of High K dielectric Constant Films," published as United States Application Publication No. 2003/0101938.

In some embodiments, the high-k dielectric film consists essentially of hafnium oxide. As used in this specification and the appended claims, the term "consists essentially of hafnium oxide" means that the film formed is intended to be a hafnium oxide film and may include unreacted hafnium containing species and unreacted oxygen containing species and impurities present in the originating gases. In detailed embodiments, the hafnium oxide film is formed by sequentially exposing the substrate surface having dangling bonds to a hafnium containing precursor followed by an oxidant. In specific embodiments, the hafnium containing precursor comprises hafnium chloride. In some embodiments, the oxidant is water.

The thickness of the high-k dielectric film can vary depending on a variety of factors including, but not limited to, the material deposited and the number of layers deposited. In general, it has be observed that high-k dielectric films deposited by the described methods result in films with greater thickness than films deposited without create dangling bonds before deposition. In specific embodiments, a hafnium oxide film is formed on a silicon substrate. The film has a thickness of at least twice that of a similarly prepared hafnium oxide film processed without annealing the native substrate surface comprising silicon hydride to create silicon dangling bonds.

Processing of the substrate, meaning any or all of the process steps (e.g., cleaning, annealing, deposition) can be carried out in a single processing chamber or in separate processing chambers. Additionally, processing can be performed in an integrated cluster tool comprising a central transfer chamber surrounded by a plurality of individual processing chambers of various types. The central transfer chamber of the cluster tool generally has at least one robot arm configured to move a substrate to and from at least one processing chamber and load lock chamber. The individual processing chambers can be single purpose or multi-purpose chambers. Using a cluster tool allows a substrate to be processed in a plurality of separate processing chambers without exposing the substrate to ambient conditions. As used in this specification and the appended claims, the term "ambient conditions" means the conditions (e.g., temperature, pressure, gaseous environment) outside the processing chamber or cluster tool. In detailed embodiments, the substrate is cleaned, annealed and a film is deposited on the substrate without exposing the substrate to ambient conditions.

The cluster tool can include at least one processing chamber, although there are typically at least two processing chambers. When two processing chambers are employed, any or all of the cleaning, annealing and depositing steps can occur in any one or combination of two processing chambers. Typically, however, the cluster tool will include at least three processing chambers, with each of the at least three processing chambers being specific to a portion of the processing method. For example, the substrate can be cleaned in a first processing chamber, annealed in a second processing chamber and have the high-k dielectric film deposited in a third processing chamber. The central transfer chamber, which has a robot therein, can move the substrate from the first processing chamber to the second processing chamber to the third processing chamber. In some embodiments, the substrate is moved between a first processing chamber and at least one second processing chamber before one or more of the annealing the native substrate surface and depositing the high-k dielectric film. In detailed embodiments, the substrate is moved from the first processing chamber to the at least one second processing chamber without being exposed to ambient conditions. In specific embodiments, the substrate is moved from the first processing chamber to a second processing chamber before annealing the substrate or before depositing the high-k dielectric film.

In an exemplary embodiment, the substrate is placed into a load lock chamber, where the substrate is isolated from the ambient environment. A robot moves the substrate from the load lock chamber, through an isolation valve into the central transfer chamber. The robot moves the substrate through another isolation valve to a first processing chamber which, after closing the isolation valve, is isolated from the central transfer chamber. The substrate is cleaned in the first processing chamber to produce a native substrate surface. After cleaning, the isolation valve is opened and the robot arm moves the substrate from the first processing chamber into the central transfer chamber and then through another isolation valve into the second processing chamber. In the second processing chamber, the native substrate surface is annealed, producing a surface with dangling bonds. After annealing, the isolation valve is opened and the robot moves the substrate into the central transfer chamber and then through another isolation valve to a third processing chamber. In the third processing chamber, a high-k dielectric film is deposited on the substrate surface having dangling bonds. The robot can then remove the substrate from the third processing chamber, through the isolation valve into the central transfer chamber and into the load lock chamber for removal from the cluster tool. In detailed embodiments, the cluster tool comprises at least one fourth processing chamber for additional substrate processing.

One or more detailed embodiments of the invention are directed to methods of processing a substrate. The substrate is disposed in a first processing chamber. The substrate surface is cleaned to produce a native substrate surface by one or more of a hydrofluoric acid wet etch or an ammonia and nitrogen trifluoride dry etch. The native substrate surface is then annealed by exposing the native substrate surface to a temperature in the range of about 600° C. to about 1100° C. to create a substrate surface with dangling bonds. The high-k dielectric film is then deposited on the substrate with dangling bonds by atomic layer deposition. Each of the cleaning, annealing and deposition processes can be performed in the first processing chamber or in a combination of first, second and/or third processing chambers. Additionally, each process can be performed in separate processing chambers in a cluster tool where the substrate is moved between the processing chambers without exposure to ambient conditions.

A specific embodiment of the invention is directed to a method of processing a substrate. A silicon substrate is disposed in a first processing chamber. The surface of the silicon substrate is cleaned in the first processing chamber to produce a native substrate surface comprising silicon hydride. The silicon substrate surface is cleaned by one or more of a hydrofluoric acid wet etch or an ammonia and nitrogen trifluoride dry etch. The native substrate surface is then annealed by exposing the substrate surface to a temperature in the range of about 700° C. to about 1100° C. to create silicon dangling bonds on the surface of the substrate. The high-k dielectric film is then deposited on the substrate surface with dangling silicon bonds by atomic layer deposition. In some embodiments, the substrate is moved from the first processing chamber to a second processing chamber before either the annealing or deposition steps.

After depositing the high-k film, additional processing may be performed. In detailed embodiments, the processing methods further comprise performing one or more of a post-deposition annealing on the high-k dielectric layer and a decoupled plasma nitridation process on the high-k dielectric layer.

EXAMPLES

Reference

A silicon substrate was cleaned by a hydrofluoric acid wet etch to remove most of the silicon oxide from the surface exposing a native substrate surface of silicon hydride. Without any surface treatment, five atomic layer deposition cycles were performed by alternately exposing the native substrate surface to hafnium tetrachloride followed by water. The thickness of the interface silicon dioxide layer and the hafnium oxide high-k film was determined by x-ray photoelectron spectroscopy (XPS).

Example A

A silicon substrate was cleaned by a hydrofluoric acid wet etch to remove the silicon oxide from the surface exposing a native substrate surface of silicon hydride. The native substrate surface was then annealed at a temperature of about 800° C. in an $N_2$ environment at a pressure of about 10 Torr for about 10 seconds. Without exposing the substrate to ambient conditions, five atomic layer depositions cycles were performed by alternately exposing the annealed substrate surface to hafnium tetrachloride followed by water. The thickness of the interface silicon dioxide and the hafnium oxide high-k film was determined by XPS.

Example B

An identical preparation as that of Sample A with the exception that annealing was done at about 90° C. The thickness of the interface silicon dioxide and the hafnium oxide high-k film was determined by XPS.

Example C

A silicon substrate was cleaned by an ammonia and nitrogen trifluoride plasma dry etch to remove the silicon oxide from the surface of the substrate. Without exposing the substrate to ambient conditions, the substrate surface was annealed in 10 Torr $N_2$ at a temperature of about 700° C. for about 10 seconds. Again, without exposing the substrate to ambient conditions, five atomic layer deposition cycles were performed by alternately exposing the annealed substrate surface to hafnium tetrachloride followed by water. The thickness of the interface silicon dioxide and the hafnium oxide high-k film was determined by XPS.

Example D

An identical preparation as that of Sample C with the exception that annealing was done at about 900° C. The thickness of the interface silicon dioxide and the hafnium oxide high-k film was determined by XPS.

Figure 2:
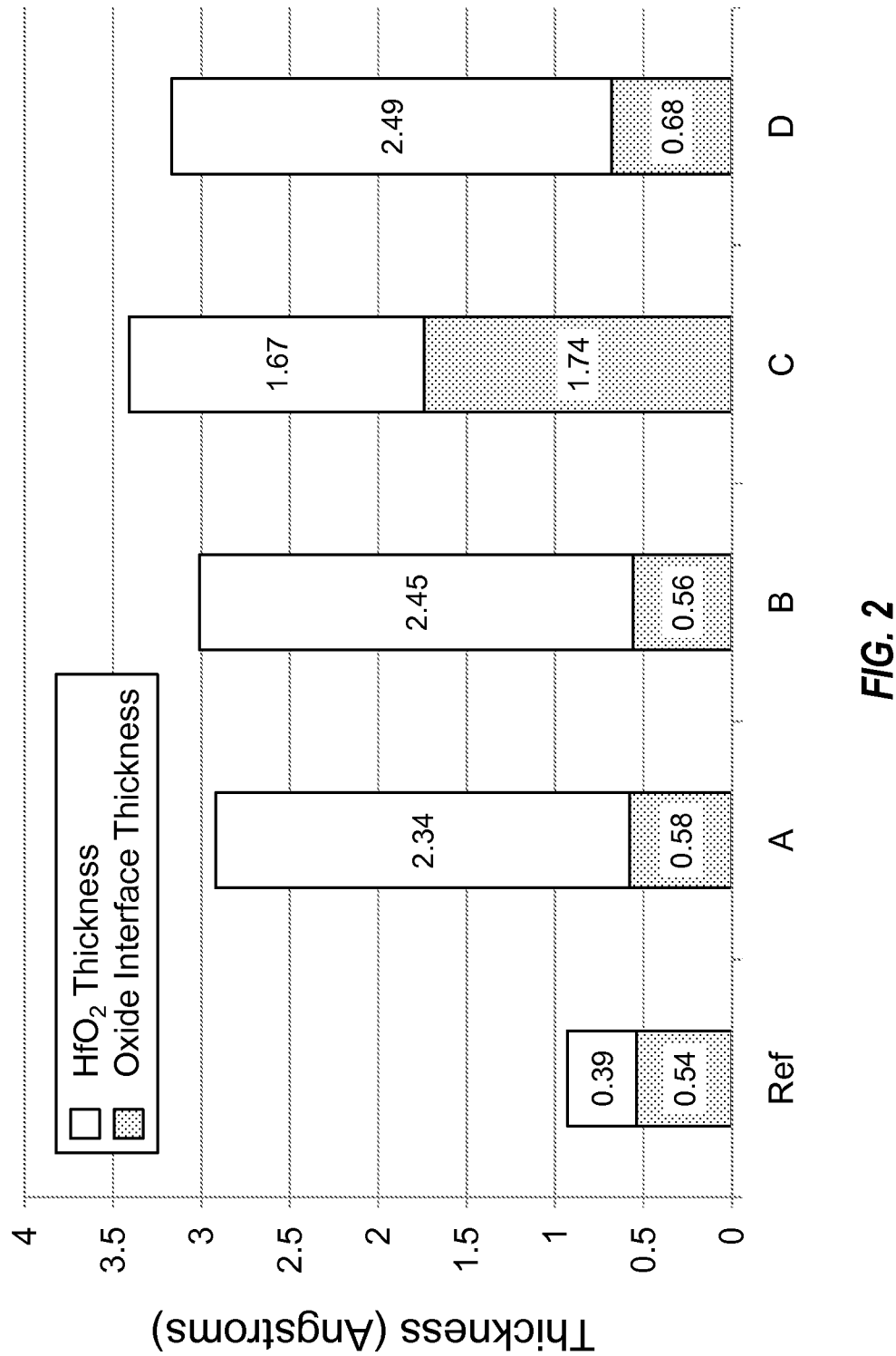
FIG. 2 is a graph of the thickness of the interface layer and a hafnium oxide high-k dielectric film after five atomic layer deposition cycles for various Examples.

The results of the thickness measurements are shown in FIG. 2. It can be seen that the thickness of the hafnium oxide film after five ALD cycles is enhanced after annealing the cleaned substrate surface.

Figure 3A:
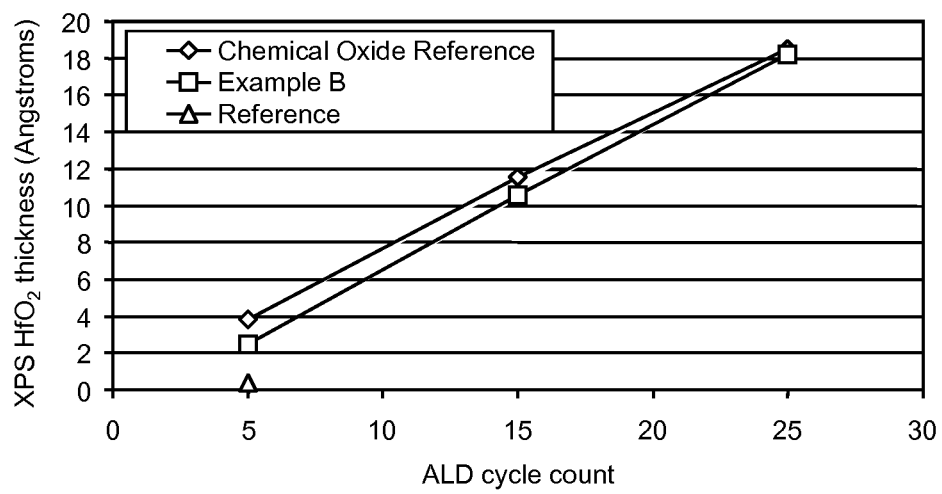
FIG. 3A is a graph of the hafnium oxide film thickness as a function of atomic layer deposition cycles for various samples.
Figure 3B:
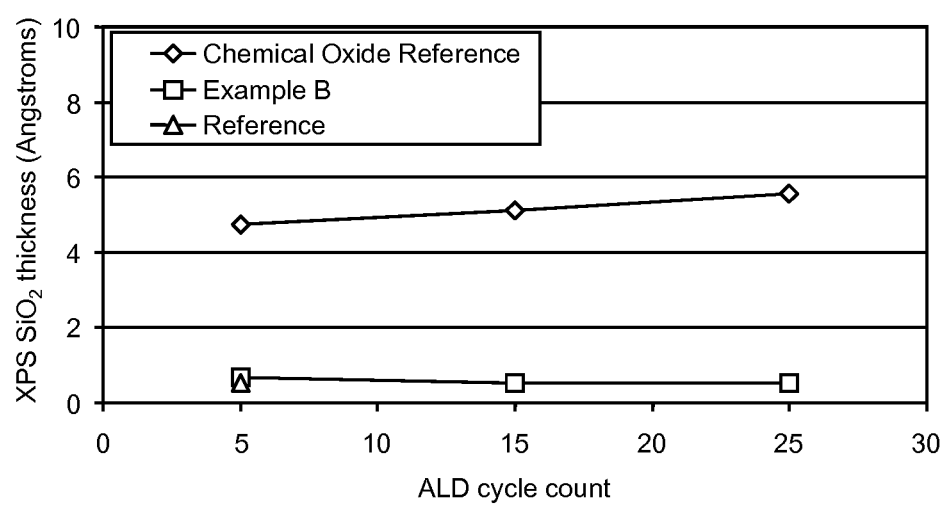
FIG. 3B is a graph of the silicon dioxide interface layer thickness as a function of atomic layer deposition cycles for various samples.

FIGS. 3A and 3B show the trend of hafnium oxide thickness for the Reference, Example B and a Chemical Oxide prepared sample beyond five ALD cycles. The XPS thickness for the silicon oxide interface layer and the hafnium oxide layer after five ALD cycles is shown for the Reference sample which was prepared by hydrofluoric acid cleaning without annealing. A reference sample was prepared using a chemical oxide interface layer. It can be seen from FIG. 3A that the hafnium oxide growth for the annealed sample (Example B) beyond the five ALD cycles nearly matches that to the reference growth trend on the chemical oxide reference. Additionally, FIG. 3B shows almost zero interface layer thickness with Example B. This may be advantageous for scaling EOT while maintaining good hafnium oxide film growth.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of processing a substrate, comprising:
cleaning a surface of the substrate to produce a native substrate surface;
annealing the native substrate surface to create a substrate surface with dangling bonds; and
depositing a high-k dielectric film on the substrate surface with dangling bonds.

2. The method of claim 1, wherein cleaning the substrate surface comprises one or more of a hydrofluoric acid wet etch and an ammonia and nitrogen trifluoride plasma dry etch procedure.

3. The method of claim 1, wherein annealing the native substrate surface comprises exposing the native substrate surface to a temperature in the range of about 600 ° C. to about 1100 ° C.

4. The method of claim 1, wherein the native substrate surface is annealed in an inert environment.

5. The method of claim 4, wherein the native substrate surface is annealed for a time in the range of about 1 seconds to about 300 seconds.

6. The method of claim 1, wherein the native substrate surface is annealed for less than 1 seconds by laser annealing.

7. The method of claim 1, wherein the high-k dielectric film comprises one or more of a metal oxide and metal silicate including an element selected from the group consisting of Hf, Zr, Ta, Al, Ti, In, rare-earth metal and combinations thereof.

8. The method of claim 1, wherein the high-k dielectric film comprises hafnium oxide.

9. The method of claim 8, wherein depositing the hafnium oxide film comprises sequentially exposing the substrate surface with dangling bonds to a hafnium-containing precursor comprising hafnium tetrachloride and an oxidant comprising water.

10. The method of claim 1, wherein the substrate comprises one or more of silicon, gallium, indium, aluminum, titanium, germanium and tin.

11. The method of claim 10, wherein the native substrate surface is the substrate surface comprising functional groups consisting of one or more of hydride, nitride, fluoride, chloride, bromide and iodide.

12. The method of claim 1, wherein the substrate is cleaned, annealed and a film is deposited without exposing the substrate to ambient conditions.

13. The method of claim 1, wherein the high-k dielectric film is deposited by atomic layer deposition.

14. A method of processing a substrate, the method comprising:
disposing the substrate having a surface in a first processing chamber;
cleaning the surface of the substrate to produce a native substrate surface, the substrate being cleaned by one or more of a hydrofluoric acid wet etch and an ammonia and nitrogen trifluoride dry etch;
annealing the native substrate surface by exposing the native substrate surface to a temperature in the range of about 600 ° C. to about 1100 ° C. to create a substrate surface with dangling bonds; and
depositing a high-k dielectric film on the substrate surface with dangling bonds by atomic layer deposition.

15. The method of claim 14, further comprising moving the substrate between the first processing chamber and at least one second processing chamber before one of the annealing or deposition.

16. The method of claim 15, wherein the substrate is moved from the first processing chamber to that at least one second processing chamber without being exposed to ambient conditions.

17. A method of processing a substrate, the method comprising:
disposing a silicon substrate having a surface in a first processing chamber;
cleaning the surface of the silicon substrate in the first processing chamber to produce a native substrate surface comprising silicon hydride, the silicon substrate surface being cleaned by one or more of a hydrofluoric acid wet etch and an ammonia and nitrogen trifluoride dry etch;
annealing the native substrate surface by exposing the native substrate surface to a temperature in the range of about 700 ° C. to about 1100 ° C. to create silicon dangling bonds on the surface of the substrate; and depositing a high-k dielectric film on the substrate surface with dangling silicon bonds by atomic layer deposition.

18. The method of claim 17, wherein depositing the high-k dielectric film comprises sequentially exposing the substrate surface having silicon dangling bonds to a hafnium containing precursor and water or ozone to form a hafnium oxide film.

19. The method of claim 18, wherein the hafnium oxide film has a thickness of at least twice that of a similarly prepared hafnium oxide film processed without annealing the native substrate surface comprising silicon hydride to create silicon dangling bonds.

20. The method of claim 17, further comprising moving the substrate from the first processing chamber to a second processing chamber before annealing the substrate or before depositing the high-k dielectric film.

* * * * *